United States Patent
Tsai et al.

[11] Patent Number: 6,043,163
[45] Date of Patent: Mar. 28, 2000

[54] HCL IN OVERETCH WITH HARD MASK TO IMPROVE METAL LINE ETCHING PROFILE

[75] Inventors: Chia-Shiung Tsai, Hsin-Chin; Chao-Cheng Chen, Tainan County; Hun-Jan Tao, Hsinchu, all of Taiwan

[73] Assignee: Taiwan Semiconductor Manufacturing Company, Ltd., Hsin-Chu, Taiwan

[21] Appl. No.: 08/999,233

[22] Filed: Dec. 29, 1997

[51] Int. Cl.[7] ............... H01L 21/00; H01L 21/3065
[52] U.S. Cl. ................................. 438/706; 438/720
[58] Field of Search ........................... 438/706, 720

[56] References Cited

U.S. PATENT DOCUMENTS

| | | | |
|---|---|---|---|
| 5,034,348 | 7/1991 | Hartwick et al. | 438/453 |
| 5,219,485 | 6/1993 | Wang et al. | 252/79.3 |
| 5,238,872 | 8/1993 | Thalapaneni | 438/453 |
| 5,387,556 | 2/1995 | Xiaobing et al. | 438/695 |
| 5,512,499 | 4/1996 | Cambou et al. | 438/179 |
| 5,522,520 | 6/1996 | Kawamoto | 438/648 |
| 5,578,163 | 11/1996 | Yachi | 156/643.1 |
| 5,582,679 | 12/1996 | Lianjun et al. | 156/651.1 |
| 5,780,315 | 7/1998 | Chao et al. | 438/8 |
| 5,789,318 | 8/1998 | Delfino et al. | 438/656 |
| 5,858,879 | 1/1999 | Chao et al. | 438/725 |
| 5,883,007 | 3/1999 | Abraham et al. | 438/714 |

*Primary Examiner*—Benjamin L. Utech
*Assistant Examiner*—Lynette T. Umez-Eronini
*Attorney, Agent, or Firm*—George O. Saile; Stephen B. Ackerman; Rosemary L.S. Pike

[57] ABSTRACT

A new method of etching metal lines using HCl in the overetch step to prevent undercutting of the metal lines is described. Semiconductor device structures are provided in and on a semiconductor substrate. The semiconductor device structures are covered with an insulating layer. A barrier metal layer is deposited overlying the insulating layer. A metal layer is deposited overlying the barrier metal layer. A hard mask layer is deposited overlying the metal layer. The hard mask layer is covered with a layer of photoresist which is exposed, developed, and patterned to form the desired photoresist mask. The hard mask layer is etched away where it is not covered by the photoresist mask leaving a patterned hard mask. The metal layer is etched away where it is not covered by the patterned hard mask to form the metal lines. Overetching is performed to remove the barrier layer where it is not covered by the hard mask wherein HCl gas is one of the etchant gases used in the overetching whereby hydrogen ions from the HCl gas react with the metal layer and the barrier metal layer to form a passivation layer on the sidewalls of the metal lines thereby preventing undercutting of the metal lines resulting in metal lines having a vertical profile. The photoresist mask is removed and fabrication of the integrated circuit device is completed.

28 Claims, 5 Drawing Sheets

HCL IN OVERETCH WITH HARD MASK TO IMPROVE METAL LINE ETCHING PROFILE

BACKGROUND OF THE INVENTION (1) Field of the Invention

The invention relates to a method of photolithographic etching of metal lines, and more particularly, to a method of photolithographic etching of sub-quarter micron metal lines without undercutting in the manufacture of integrated circuits.

(2) Description of the Prior Art

It is desired for metal lines to have a vertical profile. This is not always easy to achieve, especially for sub-quarter micron metal lines where the photoresist layer must become thinner in order to improve lithographic resolution. However, a thinner photoresist layer results in the etching away of the metal sidewall because of poor photoresist selectivity, especially with a deep ultraviolet (DUV) light source. Therefore, it is necessary to use a hard mask during metal etching in sub-quarter micron technology to protect the metal sidewalls.

FIG. 1 illustrates in cross-sectional representation a partially completed integrated circuit device of the prior art. Semiconductor substrate 10 contains semiconductor device structures, such as gate electrode 14 and source and drain regions 16. An opening has been made through the insulating layer 18 to one of the underlying source/drain regions 16. The via opening has been lined with a glue layer 22 and filled with a tungsten layer 26. A barrier metal layer 28 (for example, titanium/titanium nitride) covers the tungsten plug. A metal layer 36, such as AlCu, overlies the barrier layer. An anti-reflective coating (ARC) 38 covers the metal layer. FIG. 1 illustrates the integrated circuit device after the etching of the metal line. A portion of the hard mask 40 remains overlying the metal line stack. The conventional etchant gases $BCl_3/Cl_2/N_2$ cannot provide an attack-free sidewall solution. The metal lines will be undercut 52 near the ARC interface as shown in FIG. 1. The $N_2$ reacting with the photoresist forms a C—N chemical passivation layer. However, this layer cannot protect the metal sidewall completely from $Cl_2$ erosion or B bombardment.

One proposed solution to the undercutting problem, disclosed in co-pending U.S. patent application Ser. No. 09/020,501 (TSMC-97-091) to Lee et al, is the use of $SF_6$ gas in the overetch step to react with titanium from the barrier layer and AlCu to form $AlF_x$ or $TiF_x$ as a passivation layer. However, $SF_6$ is the etching gas used in the tungsten etchback process. If tungsten plugs underlie the metal lines in the substrate, as illustrated in FIG. 1 and especially at the endcap of the metal line, as shown in FIG. 2, the $SF_6$ etchant gas will damage the integrity of the tungsten plug 24. Also, if there is misalignment, the $SF_6$ gas may react with Cl ions to create particles within the etch chamber.

Co-pending U.S. patent application Ser. No. 08/998,673 (TSMC-97-210) to Shue et al discloses the use of a fluorine-doped silicate glass hard mask as a source of fluorine ions for forming a passivation layer of $AlF_x$ or $TiF_x$ on the metal sidewalls to prevent undercutting. U.S. Pat. No. 5,219,485 to Wang et al teaches etching a polycide layer using $BCl_3/Cl_2/$HCl. U.S. Pat. No. 5,582,679 to Lianjin et al teaches using $BCl_3/Cl_2/N_2$ at a high temperature to etch aluminum without undercutting. U.S. Pat. No. 5,578,163 to Yachi discloses the use of $BCl_3$ and $Cl_2$ to etch aluminum and then overetching with a compound containing at least a hydrogen atom to remove residual chlorine. In this patent, the sidewall is protected by a passivation layer generated by the photoresist.

SUMMARY OF THE INVENTION

A principal object of the present invention is to provide an effective and very manufacturable method of etching metal lines.

Another object of the present invention is to provide a method of etching metal lines without undercutting of the metal lines.

A further object of the present invention is to provide a method of etching metal lines having a vertical etching profile.

Yet another object of the present invention is to provide a method of etching metal lines wherein the integrity of an underlying tungsten plug is preserved.

A still further object of the present invention is to provide a method of etching metal lines using HCl in the overetch step.

Yet another object of the present invention is to provide a method of etching metal lines using HCl in the overetch step to prevent undercutting of the metal lines.

In accordance with the objects of this invention a new method of etching metal lines using HCl in the overetch step to prevent undercutting of the metal lines is achieved. Semiconductor device structures are provided in and on a semiconductor substrate. The semiconductor device structures are covered with an insulating layer. A barrier metal layer is deposited overlying the insulating layer. A metal layer is deposited overlying the barrier metal layer. A hard mask layer is deposited overlying the metal layer. The hard mask layer is covered with a layer of photoresist which is exposed, developed, and patterned to form the desired photoresist mask. The hard mask layer is etched away where it is not covered by the photoresist mask leaving a patterned hard mask. The metal layer is etched away where it is not covered by the patterned hard mask to form the metal lines. Overetching is performed to remove the barrier layer where it is not covered by the hard mask wherein HCl gas is one of the etchant gases used in the overetching whereby hydrogen ions from the HCl gas react with the metal layer and the barrier metal layer to form a passivation layer on the sidewalls of the metal lines thereby preventing undercutting of the metal lines resulting in metal lines having a vertical profile. The photoresist mask is removed and fabrication of the integrated circuit device is completed.

DESCRIPTION OF THE DRAWINGS

In the accompanying drawings forming a material part of this description, there is shown.

DESCRIPTION OF THE PREFERRED EMBODIMENTS

Figure 1:
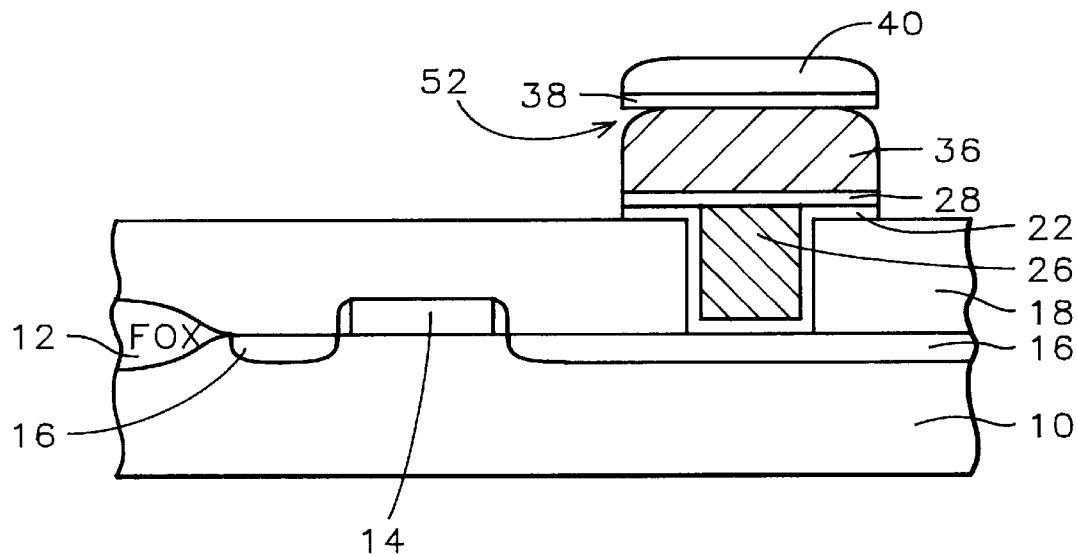
FIGS. 1 and 2 schematically illustrate in cross-sectional representation etching problems of the prior art.
Figure 2:
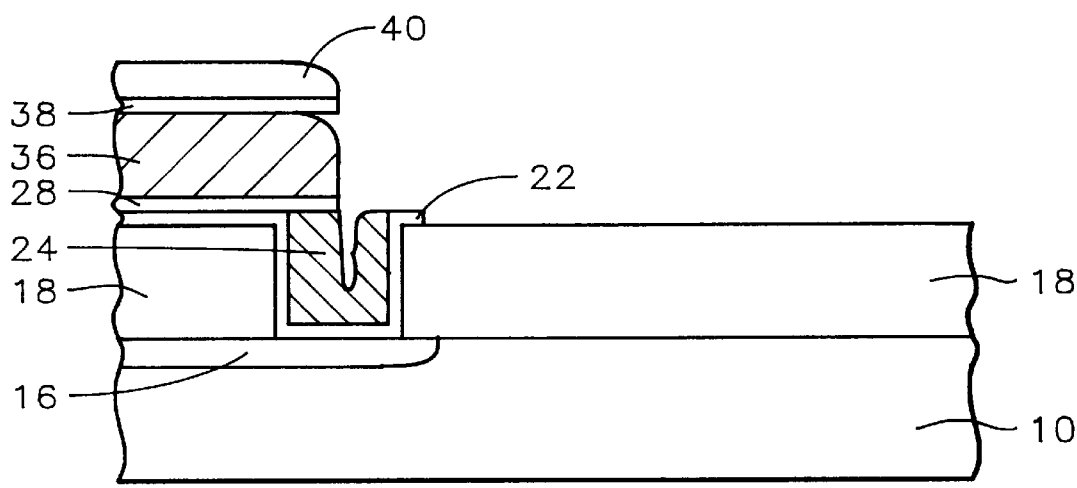
Figure 3:
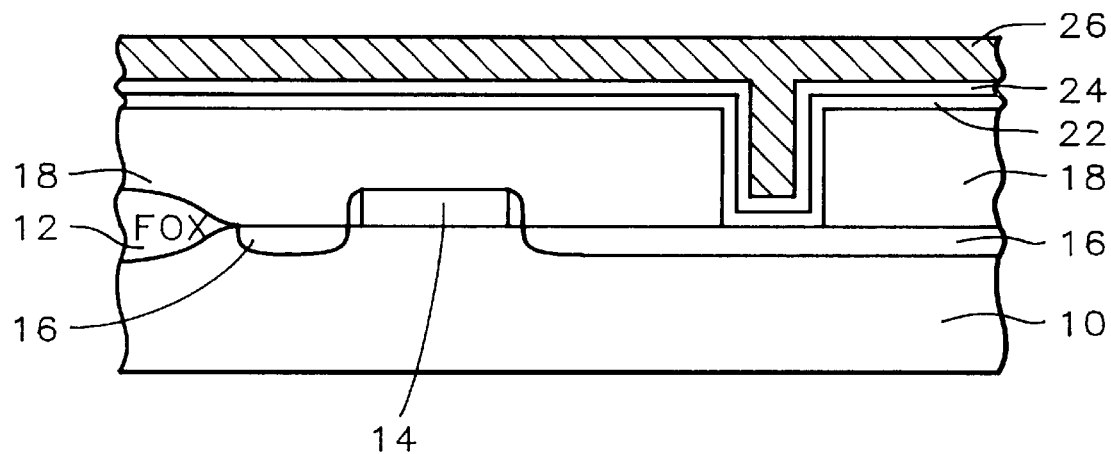
FIGS. 3 through 9 schematically illustrate in cross-sectional representation a preferred embodiment of the present invention.

Referring now more particularly to FIG. 3, there is illustrated a portion of a partially completed integrated circuit. Semiconductor substrate 10 is preferably composed of monocrystalline silicon. Field oxide regions 12 have been formed as is conventional in the art in the semiconductor substrate 10. Semiconductor device structures, including gate electrode 14 and source and drain regions 16, are fabricated in and on the semiconductor substrate. A thick insulating layer of silicon dioxide or borophosphosilicate glass (BPSG), or the like, 18 is blanket deposited over the semiconductor device structures.

A tungsten plug may be formed as is conventional in the art. A glue layer 22, typically titanium, is deposited within the via opening in the insulating layer 18. A barrier layer 24, typically titanium nitride, is deposited overlying the glue layer. Tungsten layer 26 is deposited over the substrate and filling the via opening.

Figure 4:
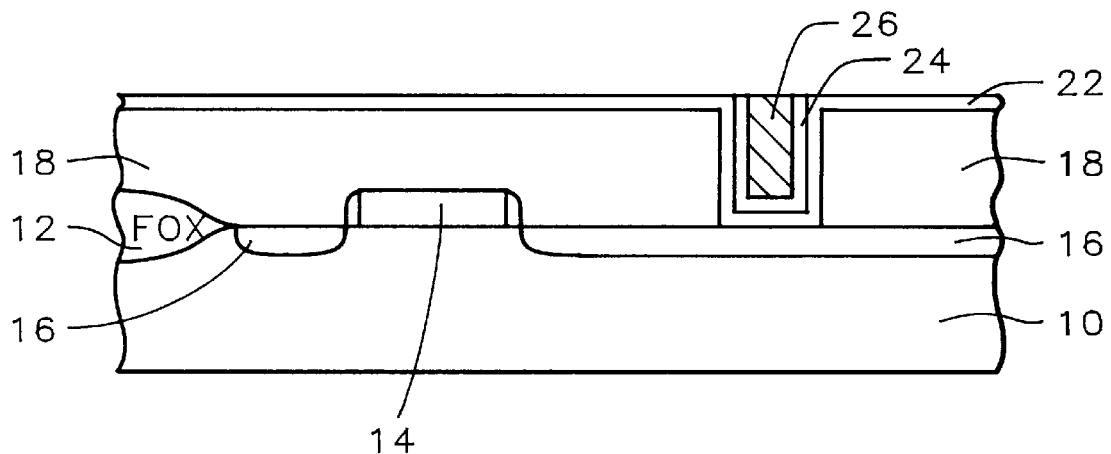

The tungsten and titanium nitride layers are etched back to leave the tungsten plug 26 filling the via opening, as shown in FIG. 4.

Figure 5:
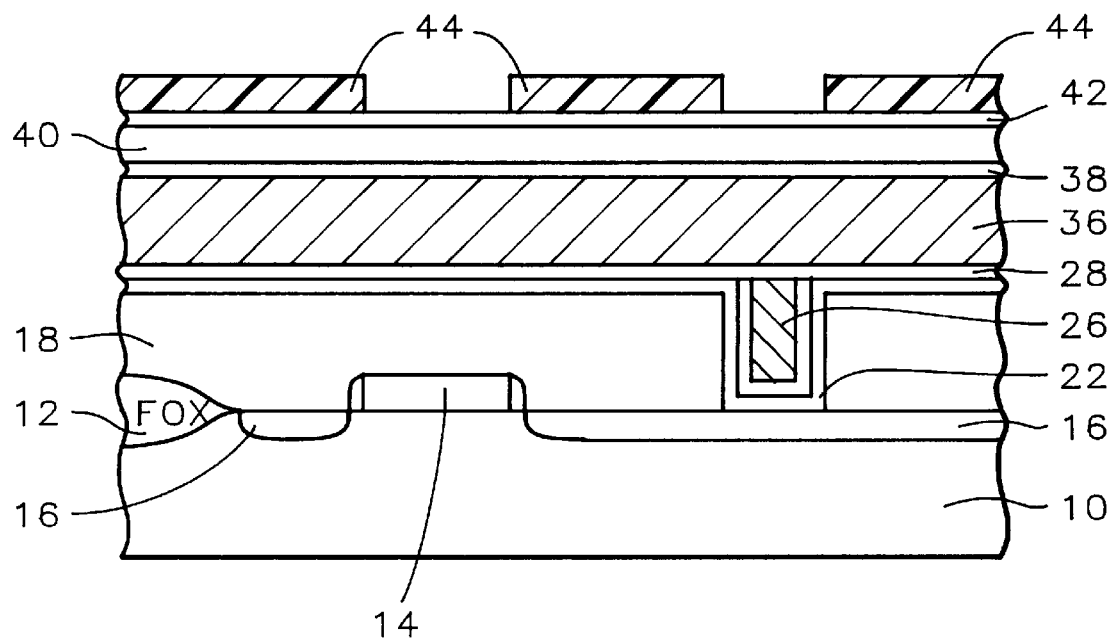

Now, referring to FIG. 5, the metal lines of the present invention will be fabricated. A barrier layer 28 is deposited over the titanium layer 22 and the tungsten plug 26. This may be titanium nitride having a thickness of between about 250 and 350 Angstroms.

The metal layer 36 is deposited over the barrier layer 28. The metal layer comprises Aluminum or an Aluminum alloy such as AlSi, AlCu, or AlSiCu and is sputter deposited to a thickness of between about 4000 and 8000 Angstroms. An anti-reflective coating (ARC) 38, such as titanium nitride, is deposited over the metal layer 36.

Next, a layer of silicon oxide or silicon oxynitride 40 is deposited overlying the ARC layer to a thickness of between about 500 and 1000 Angstroms. This layer will form the hard mask for etching the metal lines.

An organic barrier and anti-reflective coating layer (BARC) 42 may be coated over the hard mask layer 40 to a thickness of 500 to 1000 Angstroms.

A layer of photoresist is coated over the BARC layer 42 and is exposed and developed to form the photoresist mask 44. In the process of the present invention, the photoresist layer has a thickness of between about 760 and 900 Angstroms. Conventionally for sidewall protection, the photoresist mask must be as thick as between about 1200 and 1500 Angstroms, but a thinner photomask is required for sub-quarter micron technology.

Figure 6:
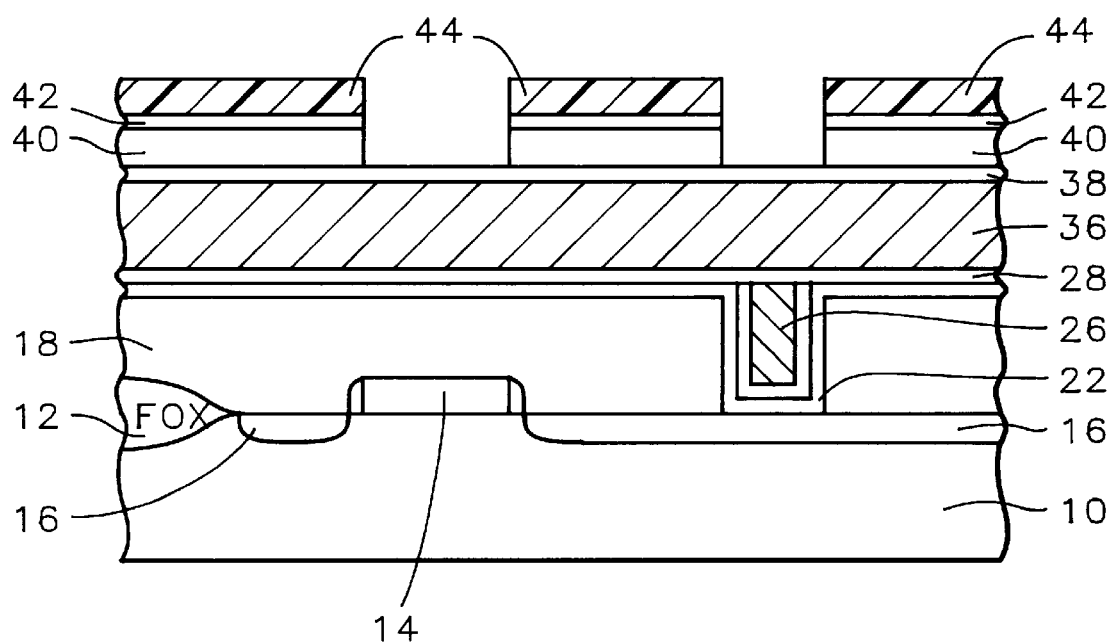

The BARC layer 42 and the hard mask layer 40 are etched away where they are not covered by the photoresist mask 44, as illustrated in FIG. 6, to form the hard mask.

Figure 7:
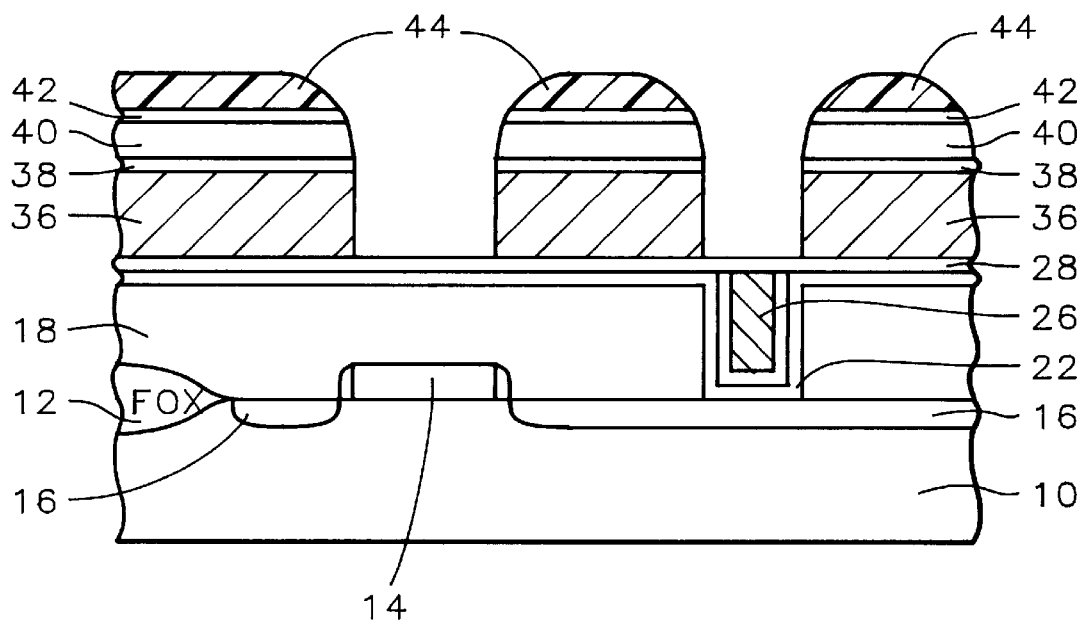
Figure 8:
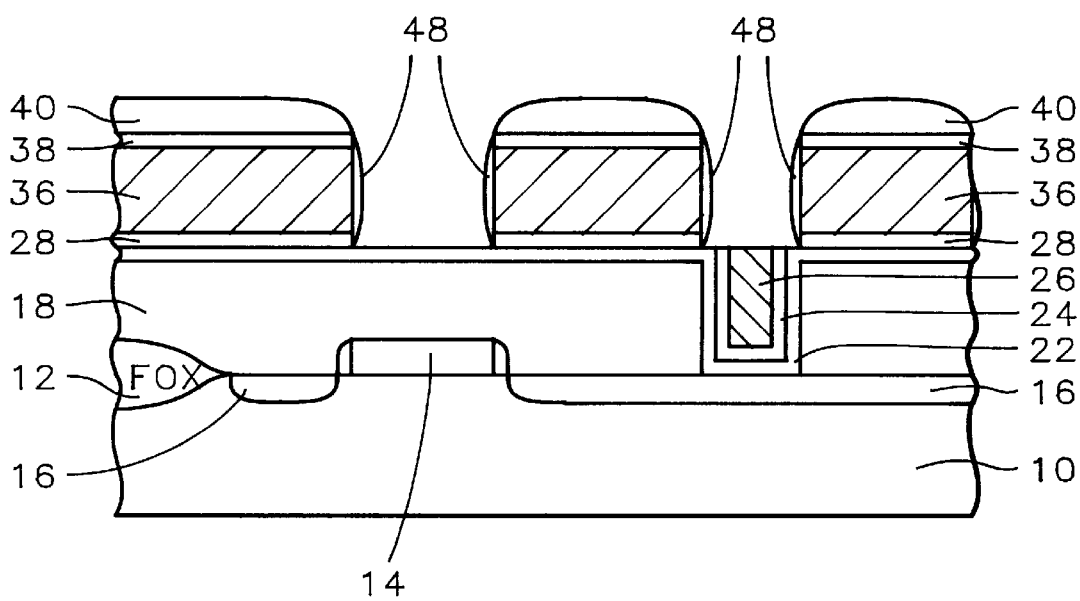

Now, the metal line stack is to be etched away where it is not covered by the hard mask, as illustrated in FIG. 7. The metal line stack is etched using $BCl_3/Cl_2/N_2$ chemistry; for example, flowing $BCl_3$ at 15 to 60 sccm, flowing $Cl_2$ at 70 to 100 sccm, and flowing $N_2$ at 15 to 25 sccm with a pressure of 10 to 15 mTorr and power of 500 to 750 watts.

After the main etch is completed, an overetch is performed. In open areas, the overetch will remove the barrier layer 28. In dense areas, residual aluminum is also removed. The process of the present invention uses HCl gas in place of $BCl_3$ gas for the overetch step. The $N_2$ reacting with the photoresist forms a C—N chemical passivation layer. However, this layer cannot protect the metal sidewall completely from $Cl_2$ erosion or B bombardment because the photoresist mask is so thin. An additional source gas for the formation of the passivation layer is required. The addition of HCl gas during the overetch will prevent the undercutting of the metal lines at the ARC interface. The HCl gas will react with the aluminum or aluminum alloy and the titanium in the barrier layer to form the nonvolatile product $AlH_x$ or $TiH_x$. The $AlH_x$ or $TiH_x$ forms a passivation layer 48 on the sidewalls of the metal stack, thus preventing undercutting. The presence of photoresist is not necessary during the overetch step because the addition of HCl provides all the passivation necessary to protect the sidewalls of the metal stack.

For example, in the overetch step, HCl is flowed at 10 to 30 sccm, $Cl_2$ is flowed at 70 to 100 sccm, and $N_2$ is flowed at 15 to 25 sccm at a pressure of 10 to 15 mTorr and power of 200 to 400 watts for 30 to 50 seconds.

The passivation layer 48 protects the metal sidewalls and prevents undercutting during overetch. The HCl does not etch tungsten, as $SF_6$ does, so that the integrity of the tungsten plug is maintained. The addition of HCl to the overetch step has been performed experimentally. It has been found that the process of the invention prevents metal undercutting and that the addition of HCl to overetch step does not effect significantly the overetch rate.

Figure 9:
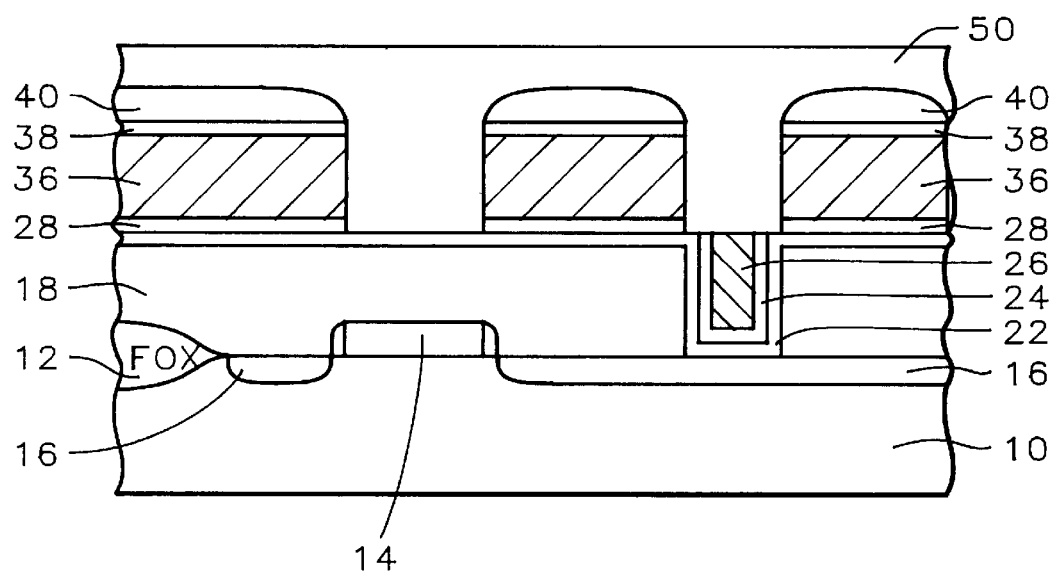

FIG. 9 shows the completed metal lines 36 having a vertical profile. The sidewall passivation 48 is removed by a conventional polymer removal process. Intermetal dielectric or passivation layer 50 is deposited over the metal lines. Another level of metallization now may be fabricated according to the process of the present invention.

The process of the invention adds HCl gas to the overetch step in place of $BCl_3$ gas. The HCl gas reacts with the metal line and/or the barrier layer to form $AlH_x$ or $TiH_x$ which protects the sidewall of the metal line during overetching.

While the invention has been particularly shown and described with reference to the preferred embodiments thereof, it will be understood by those skilled in the art that various changes in form and details may be made without departing from the spirit and scope of the invention.

What is claimed is:

1. A method of forming metal lines having a vertical profile in the fabrication of an integrated circuit comprising:

providing semiconductor device structures in and on a semiconductor substrate;

covering said semiconductor device structures with an insulating layer;

depositing a barrier metal layer overlying said insulating layer;

depositing a metal layer overlying said barrier metal layer;

depositing a hard mask layer overlying said metal layer;

covering said hard mask layer with a layer of photoresist;

exposing said photoresist layer to actinic light and developing and patterning said photoresist layer to form the desired photoresist mask;

etching away said hard mask layer where it is not covered by said photoresist mask leaving a patterned hard mask;

etching away said metal layer not covered by said patterned hard mask to form said metal lines wherein said etching is performed by the etchant gases $BCl_3$, $Cl_2$, and $N_2$;

overetching to remove said barrier layer where it is not covered by said hard mask wherein said overetching is performed by the etchant gases HCl, $Cl_2$, and $N_2$ whereby hydrogen ions from said HCl gas react with said metal layer and said barrier metal layer to form a passivation layer on the sidewalls of said metal lines thereby preventing undercutting of said metal lines resulting in said metal lines having said vertical profile;

removing said photoresist mask; and completing said fabrication of said integrated circuit.

2. The method according to claim 1 wherein said semiconductor device structures include gate electrodes and source and drain regions.

3. The method according to claim 1 further comprising forming a tungsten plug through said insulating layer to contact one of said semiconductor device structures.

4. The method according to claim 1 wherein said barrier layer comprises titanium nitride with a thickness of between about 250 and 350 Angstroms.

5. The method according to claim 1 wherein said metal layer comprises AlCu having a thickness of between about 4000 and 8000 Angstroms.

6. The method according to claim 1 further comprising depositing a first anti-reflective coating layer overlying said metal layer wherein said first anti-reflective coating layer comprises titanium.

7. The method according to claim 1 wherein said hard mask layer comprises silicon oxide and has a thickness of between about 500 and 1000 Angstroms.

8. The method according to claim 1 wherein said hard mask layer comprises silicon oxynitride and has a thickness of between about 500 and 1000 Angstroms.

9. The method according to claim 6 further comprising depositing a second anti-reflective coating layer overlying said hard mask layer wherein said second anti-reflective coating layer comprises titanium.

10. The method according to claim 1 wherein said photoresist layer has a thickness of between about 760 and 900 Angstroms.

11. The method according to claim 1 wherein said overetching comprises flowing $Cl_2$ gas at the rate of 70 to 100 sccm, flowing $N_2$ at the rate of 15 to 25 sccm, and flowing HCl at the rate of 10 to 30 sccm at a pressure of 10 to 15 mTorr and power of 200 to 400 watts.

12. The method according to claim 1 wherein said passivation layer comprises $AlH_x$.

13. The method according to claim 1 wherein said passivation layer comprises $TiH_x$.

14. The method according to claim 1 wherein said passivation layer comprises $AlH_x$ and $TiH_x$.

15. A method of forming metal lines having a vertical profile in the fabrication of an integrated circuit comprising:

providing semiconductor device structures in and on a semiconductor substrate;

covering said semiconductor device structures with an insulating layer;

forming a tungsten plug through said insulating layer to contact one of said semiconductor device structures;

depositing a barrier metal layer overlying said insulating layer and said tungsten plug;

depositing a metal layer overlying said barrier metal layer;

depositing a first anti-reflective coating layer overlying said metal layer;

depositing a hard mask layer overlying said first anti-reflective coating layer;

depositing a second anti-reflective coating layer overlying said hard mask layer;

covering said second anti-reflective coating layer with a layer of photoresist;

exposing said photoresist layer to actinic light and developing and patterning said photoresist layer to form the desired photoresist mask;

etching away said hard mask layer where it is not covered by said photoresist mask leaving a patterned hard mask;

etching away said metal layer not covered by said patterned hard mask to form said metal lines wherein said etching is performed by the etchant gases $BCl_3$, $Cl_2$, and $N_2$;

overetching to remove said barrier layer where it is not covered by said hard mask wherein said overetching is performed by the etchant gases HCl, $Cl_2$, and $N_2$ whereby hydrogen ions from said HCl gas react with said metal layer and said barrier metal layer to form a passivation layer on the sidewalls of said metal lines thereby preventing undercutting of said metal lines resulting in said metal lines having said vertical profile;

removing said photoresist mask; and completing said fabrication of said integrated circuit.

16. The method according to claim 15 wherein said semiconductor device structures include gate electrodes and source and drain regions.

17. The method according to claim 15 further comprising forming a tungsten plug through said insulating layer to contact one of said semiconductor device structures.

18. The method according to claim 15 wherein said barrier layer comprises titanium nitride with a thickness of between about 250 and 350 Angstroms.

19. The method according to claim 15 wherein said metal layer comprises AlCu having a thickness of between about 4000 and 8000 Angstroms.

20. The method according to claim 15 wherein said first anti-reflective coating layer comprises titanium.

21. The method according to claim 15 wherein said hard mask layer comprises silicon oxide and has a thickness of between about 500 and 1000 Angstroms.

22. The method according to claim 15 wherein said hard mask layer comprises silicon oxynitride and has a thickness of between about 500 and 1000 Angstroms.

23. The method according to claim 15 wherein said second anti-reflective coating layer comprises titanium.

24. The method according to claim 15 wherein said photoresist layer has a thickness of between about 760 and 900 Angstroms.

25. The method according to claim 15 wherein said overetching comprises flowing $Cl_2$ gas at the rate of 70 to 100 sccm, flowing $N_2$ at the rate of 15 to 25 sccm, and flowing HCl at the rate of 10 to 30 sccm at a pressure of 10 to 15 mTorr and power of 200 to 600 watts.

26. The method according to claim 15 wherein said passivation layer comprises $AlH_x$.

27. The method according to claim 15 wherein said passivation layer comprises $TiH_x$.

28. The method according to claim 15 wherein said passivation layer comprises $AlH_x$ and $TiH_x$.

* * * * *